(12) United States Patent
Harrah

(10) Patent No.: US 8,193,557 B2
(45) Date of Patent: Jun. 5, 2012

(54) SUB-ASSEMBLY FOR A LIGHT-EMITTING DEVICE PACKAGE AND A LIGHT EMITTING DIODE PACKAGE WITH FEATURES PREVENTING ENCAPSULANT DELAMINATION

(75) Inventor: Shane Harrah, Sunnyvale, CA (US)

(73) Assignee: Bridgelux, Inc., Livermore, CA (US)

(*) Notice: Subject to any disclaimer, the term of this patent is extended or adjusted under 35 U.S.C. 154(b) by 171 days.

(21) Appl. No.: 12/763,876

(22) Filed: Apr. 20, 2010

(65) Prior Publication Data
US 2011/0255263 A1   Oct. 20, 2011

(51) Int. Cl.
*H01L 33/00* (2010.01)
*F21V 15/00* (2006.01)

(52) U.S. Cl. ........... 257/99; 257/E33.001; 257/E33.055; 362/362

(58) Field of Classification Search .............. 257/79, 257/99, 100, 666, 667, 676, 678, 687, E33.001, 257/E33.055; 362/84, 362, 382, 368, 375, 362/374
See application file for complete search history.

(56) References Cited

U.S. PATENT DOCUMENTS

| | | | | |
|---|---|---|---|---|
| 6,903,380 | B2* | 6/2005 | Barnett et al. | 257/98 |
| 2006/0186423 | A1* | 8/2006 | Blonder et al. | 257/98 |
| 2008/0054288 | A1* | 3/2008 | Harrah et al. | 257/99 |

OTHER PUBLICATIONS

ISP OPTICS Specification. ISPOPTICS, Nov. 2011, WWW.ISPOPTICS.COM.*

* cited by examiner

*Primary Examiner* — A. Sefer
*Assistant Examiner* — Nikolay Yushin
(74) *Attorney, Agent, or Firm* — Pavel Kalousek

(57) ABSTRACT

A sub-assembly of a light-emitting device package and/or a light-emitting device package, the package comprising a cavity filled with an encapsulant, are disclosed with means preventing the encapsulant delamination. The means comprise an expansion volume within the light-emitting device package, together with means allowing the encapsulant to flow from the cavity into the expansion volume as the encapsulant expands, and to flow back into the cavity as the encapsulant contracts during heating and cooling of the light-emitting device package.

41 Claims, 4 Drawing Sheets

SUB-ASSEMBLY FOR A LIGHT-EMITTING DEVICE PACKAGE AND A LIGHT EMITTING DIODE PACKAGE WITH FEATURES PREVENTING ENCAPSULANT DELAMINATION

BACKGROUND

1. Field

The present disclosure relates to a light-emitting device package, and more particularly, to the features of a sub-assembly of the light-emitting device package and/or of the package preventing encapsulant delamination.

2. Description of Related Technology

Although a person skilled in the art will appreciate that the concepts disclosed in this application are applicable to packages for semiconductor-based light-emitting devices, examples of which include, but are not limited to a light-emitting diode (LED) and a laser diode (LD), the state of related technology is explained using an LED as a typical example of a light-emitting device without any loss of generality, merely to avoid undue repetitiveness of the disclosure.

LEDs have been used for many years in various light emitting applications. Due to LEDs' advantages, i.e., light-weight, low energy consumption, good electrical power to light conversion efficiency, and the like, an increased interest has been recently focused on use of light-emitting diodes for high light intensity application, e.g., replacement of conventional, i.e., incandescent and fluorescent, light sources. To increase intensity of the light emitted by the light-emitting device if a design goal so requires, often more than one light-emitting die is arranged in a package. For the purposes of this disclosure a die has its common meaning of a light-emitting semiconductor chip comprising a p-n junction. Similarly, a package is a collection of components comprising a light-emitting device including but not being limited to: a substrate, a die or dice, encapsulant, bonding material(s), light collecting means, and the like. A person skilled in the art will appreciate that some of the components are optional.

FIG. 1 depicts a conceptual cross section of an exemplary light-emitting device 100 in accordance with known concepts. A substantially flat substrate 102 in addition to being a mechanical support is often used as a means for heat dissipation from the light-emitting device. When used in the latter function the substrate 102 is made from a material with high thermal conductivity. Such material may comprise metals, e.g., Al, Cu, Si-based materials, ceramics such as AlN, or any other material whose thermal conductivity is appropriate for the light-emitting device in question. A person skilled in the art will appreciate that material appropriate for a light-emitting device with power dissipation of, e.g., 35 milliwatts (mW) is different than material appropriate for a light-emitting device with power dissipation of, e.g., 350 mW. Flatness is understood to describe irregularities whose spacing is greater than the roughness sampling length. A material is considered to be substantially flat if the irregularities in flatness would not cause light to be reflected by such irregularities.

The source of light is at least one die 114, disposed on an upper face 104 of the substrate 102. Although four dice 114 are depicted in FIG. 1, a person skilled in the art will appreciate that such is for an illustration of the concept because the number of dice is a design decision, and one die may be sufficient should it satisfy design goals.

To improve light extraction from the light-emitting device 100, several measures are taken. First, surfaces that are transparent to photons emitted at a particular wavelength or that have poor reflectivity of such photons in an undesirable direction of emission may be treated, e.g., by polishing, buffing, or any other process, to acquire a specific reflectivity. Reflectivity is characterized by a ratio of reflected to incident light. Such surfaces are an upper face 104 of the substrate 102 and inner wall 106 of a support member 108. The support member 108 provides boundary for an encapsulant 110 and reflects light emitted by the die or dice 114 into desirable direction. Alternatively, the desired reflectivity is achieved by applying a layer of a material with high reflectivity, such as Ag, Pt, and any like materials known to a person skilled in the art, (not shown in FIG. 1) onto such surfaces.

Furthermore, to prevent reflection of the emitted photons from boundaries between materials characterized by different refraction indexes, and, consequently, loss of light intensity, an encapsulant 110 is applied into a cavity 112 surrounding the light-emitting region, i.e., the cavity created by the substrate 102, the support member 108, and the die or dice 114. The material for the encapsulant 110 is selected to moderate the differences between the refraction indexes of the materials from which components creating the reflective boundaries are made. In one aspect of the disclosure the encapsulant 110 is clear, i.e., comprising no fillers. However, the disclosed concepts apply equally to encapsulant 110 comprising fillers, e.g., phosphors.

Finally, certain light-emitting device packages further comprise a light-transmissive cover 116 disposed above the die or dice 114. Such a light-transmissive cover comprises e.g., a window for a protection of the inside of the cavity against environmental elements, or a lens for further focusing the emitted light. In order to prevent delamination of the encapsulant 110 from the surface of the light-transmissive cover 116 and/or the inner wall of the support member 108 and/or the die or dice 114 and/or the substrate 102, the light-transmissive cover 116 is allowed to float freely on the encapsulant 110, without being rigidly attached to the support member 108 with an adhesive or another fastening means. Such a configuration prevents significant residual stress, caused by temperature variation as the light-emitting device 100 heats and cools during the device's lifetime, to develop within the encapsulant 110. Because any delamination would introduce voids in the encapsulant, the resulting internal reflection optical losses caused by the above-described difference between materials characterized by different refraction indexes would cause loss of light intensity.

Although the configuration depicted in FIG. 1 may be suitable for LED packages comprising a clear light-transmissive cover, it is not particularly suitable for LED package comprising a light-transmissive cover coated or filled with phosphors; such a light-transmissive cover being often used for light conversion. An advantage of such a configuration is that the window or lens coated or filled with phosphors can be matched appropriately with a LED die or dice of known wavelength to achieve a more precisely controlled color corrected temperature (CCT). Different windows or lenses may have different phosphor coatings or fillings, and these matched with LED die or dice of optimal wavelength to achieve target CCT as needed.

However, a problem with this configuration arises from the fact that the temperature of the phosphor coated or filled light-transmissive cover increases significantly during operation of the light-emitting device because the conversion inefficiency of the phosphors results in generating significant heat. The increase in the temperature in turn results in decreased efficiency of the light-emitting device due to the decrees in light-conversion efficiency of the phosphors and decrease of efficiency of the die.

The above-described problem may be solved by a configuration according to FIG. 2, which depicts a conceptual cross section of another exemplary light-emitting device 200 in accordance with known concepts. The description of like elements between FIG. 1 and FIG. 2 is not repeated, the like elements have reference numerals differing by 100, i.e., reference numeral 102 of FIG. 1 becomes reference numeral 202 in FIG. 2.

Referring to FIG. 2, the main conceptual difference from FIG. 1 is that a light-transmissive cover 216 coated or filled with phosphors is attached to the upper face 218 of the thermally conductive support member 208. The bottom face 220 of the support member 208 is attached to a thermally conductive substrate 202. Thus, in this aspect, the support member further serves as supporting means for the light-transmissive cover 216. The light-transmissive cover 216, the support member 208, and the substrate 202 should be attached to one another using any thermally conductive means (not shown in FIG. 2) to maximize heat transfer between these components. By the means of example, such a thermally conductive means may comprise any thermally conductive adhesive or solder material, such as metal filled epoxy, eutectic alloy solder, and any other thermally conductive means known to a person skilled in the art. Furthermore, it is desirable that the light-transmissive cover 216 is also made from a thermally conductive martial. Such a configuration allows heat to flow from the phosphors through the window or the lens 216 and then through the support member 208 to the substrate 202.

A person skilled in the art will appreciate that in an alternative configuration; the light-transmissive cover 216 and the support member 202 do not need to comprise two separate components, but may be designed as a single component.

Since the heat from the light-transmissive cover 216 coated or filled with phosphors is now transferred to the substrate 202, proper heat dissipation from the LED package 200 must be assured to prevent loss of efficiency due to increased temperature of the die or dice 214. Such heat dissipation may be achieved by proper design of the above-described components of the LED package 214. In addition, the LED package 200 may further be attached to a suitable heat sink (not shown).

In any of the above-described configurations, the LED package 200 can operate without the phosphors or the LED die or dice over-heating beyond temperature that would significantly decrease the efficiency and/or reliability of the LED die or dice and the phosphors. A person skilled in the art will appreciate that the term significant describes a decrease in efficiency that would cause the light-emitting device performance fail to meet typical or minimum specification over the product life of the light-emitting device.

Although the configuration depicted in FIG. 2 solves the overheating problem, the above-alluded to problem of residual stress in the clear encapsulant 210 is re-introduced. The material commonly used for the clear encapsulant 210 is characterized by a relatively high coefficient of thermal expansion (CTE); consequently, the clear encapsulant 210 tends to undergo relatively high volumetric changes during the heating and cooling of the light-emitting device 200. In contrast, the cavity 212 undergoes only relatively small volumetric changes because the materials commonly used for components creating the cavity 212, are characterized by a relatively low CTE. A person skilled in the art will appreciate that the term "relatively" is used herein as disclosed infra. Examples of such commonly used materials are: silicone rubber, silicone gel (the clear encapsulant 210), Al, Cu, AlN (the substrate 202), Al, Ag plated Cu (the support member 208), sapphire, glass (the light-transmissive cover 216), light-emitting semiconductor material (the LED die or dice 214). The disparity in the volumetric changes result in a significant residual stress within the silicone encapsulant during heating or cooling; thus potentially resulting in delamination of the encapsulant 210 from the surface of the light-transmissive cover 216 and/or the inner wall 206 of the support member 208 and/or the die or dice 214 and/or the substrate 202. As already mentioned above, such delamination can reduce the optical efficiency of the LED package, reducing the light intensity.

Accordingly, there is a need in the art for improvements in light-emitting device packages by providing means preventing the encapsulant delamination, increasing reliability and light extraction efficiency, and additional advantages evident to a person skilled in the art.

SUMMARY

In one aspect of the disclosure, a sub-assembly of a light-emitting device package and/or a light-emitting device package with means preventing an encapsulant delamination according to appended independent claims is disclosed. Additional aspects are disclosed in the dependent claims.

BRIEF DESCRIPTION OF THE DRAWINGS

The foregoing aspects described herein will become more readily apparent by reference to the following description when taken in conjunction with the accompanying drawings wherein.

DETAILED DESCRIPTION

Figure 1:
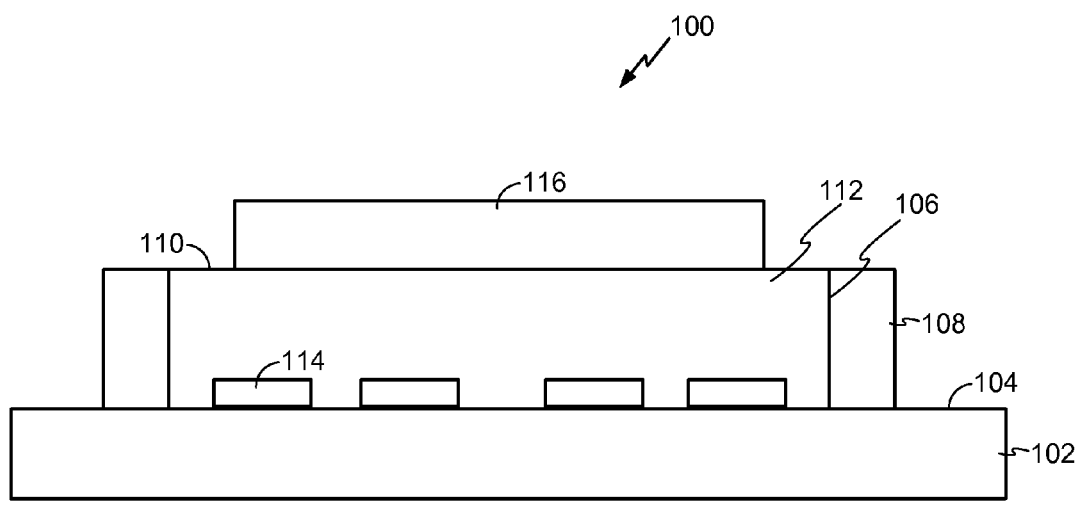
FIG. 1 depicts a conceptual cross section of an exemplary light-emitting device in accordance with known concepts.

Various aspects of the present invention will be described herein with reference to drawings that are schematic illustrations of idealized configurations of the present invention. As such, variations from the shapes of the illustrations as a result, for example, manufacturing techniques and/or tolerances, are to be expected. Thus, the various aspects of the present invention presented throughout this disclosure should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present invention.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" on another element, it can be grown, deposited, etched, attached, connected, coupled, or otherwise prepared or fabricated on the other element or an intervening element.

Furthermore, relative terms, such as "lower" or "bottom" and "upper" or "top," may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements disclosed as being on the "lower" side of other elements would then be oriented on the "upper" side of the other elements. The term "lower" can therefore encompass both an orientation of "lower" and "upper," depending of the particular orientation of the apparatus. Similarly, if an apparatus in the drawing is turned over, elements described as "below" or "beneath" other elements would then be oriented "above" the other elements. The terms "below" or "beneath" can therefore encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this disclosure.

As used herein, the singular forms "a," "an," and the are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Various disclosed aspects may be illustrated with reference to one or more exemplary configurations. As used herein, the term "exemplary" means "serving as an example, instance, or illustration," and should not necessarily be construed as preferred or advantageous over other configurations disclosed herein.

Furthermore, various descriptive terms used herein, such as "on" and "transparent," should be given the broadest meaning possible within the context of the present disclosure. For example, when a layer is said to be "on" another layer, it should be understood that that one layer may be deposited, etched, attached, or otherwise prepared or fabricated directly or indirectly above or below that other layer. In addition, something that is described as being "transparent" should be understood as having a property allowing no significant obstruction or absorption of electromagnetic radiation in the particular wavelength (or wavelengths) of interest, unless a particular transmittance is provided.

FIG. 3 depicts a conceptual cross section of an exemplary light-emitting device 300 in accordance with an aspect of this disclosure. The description of like elements among FIG. 1, FIG. 2 and FIG. 3 is not repeated, the like elements have reference numerals differing by multiples of 100, e.g., reference numeral 100 of FIG. 1 becomes reference numeral 300 in FIG. 3.

Figure 2:
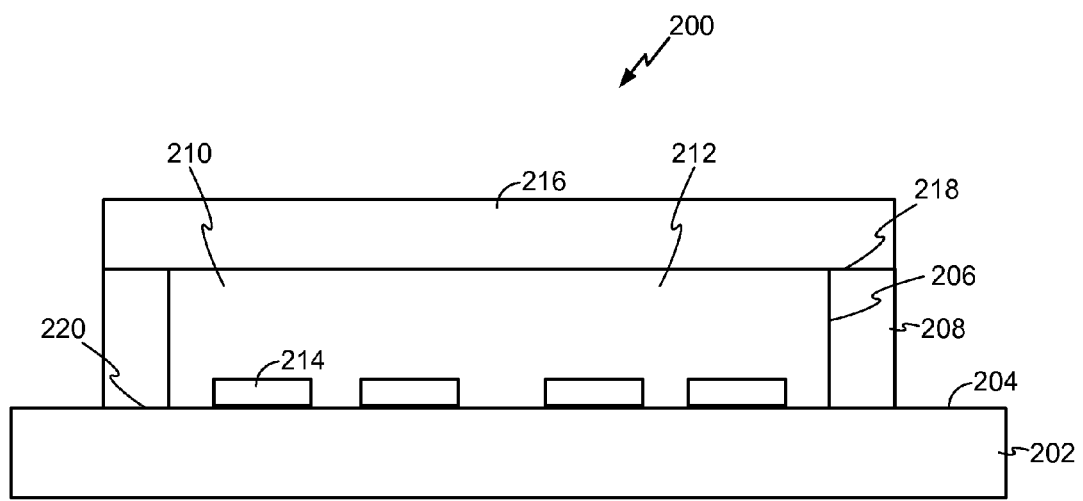
FIG. 2 depicts a conceptual cross section of another exemplary light-emitting device in accordance with known concepts.

The various configurations in accordance with the aspects of this disclosure as depicted in the below disclosed FIG. 3(a)-(f) differ from the configuration in accordance with known concepts as depicted in FIG. 2 in that an expansion volume is provided within the light-emitting device package; allowing the encapsulant 310, to flow from the cavity 312 into the expansion volume as the encapsulant 310 expands, and to flow back into the cavity 312 as the encapsulant 310 contracts during heating and cooling of the LED package 300. Such a flow relieves internal stresses within the encapsulant 310. The expansion volume is connected with, but separate from a volume comprising the inside of the cavity 312. The inside of the cavity 312 is delimited by a light-transmissive cover 316, a support member 308, and an upper face 304 of a substrate 302.

Figure 3A:
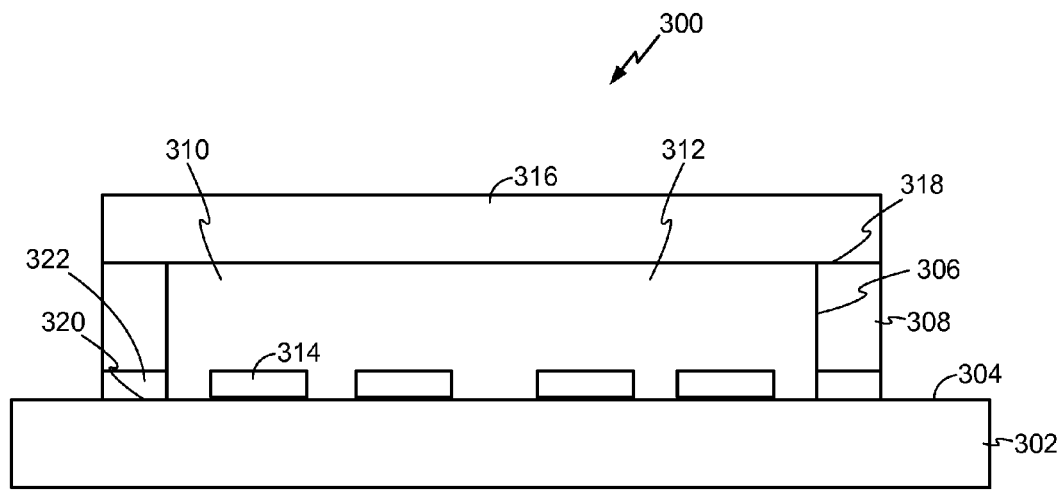
FIG. 3 depicts a conceptual cross section of an exemplary light-emitting device in accordance with an aspect of this disclosure.

Referring now to FIG. 3(a), one or a plurality of openings 322 (plurality shown), is introduced into the bottom face 320 of the support member 308. As depicted, the at least one opening 322 is a through opening. The through opening 322 originates inside the cavity 312, i.e., the inner wall 306 of the support member 308, and passes completely through the support member 308. The opening 322 thus connects the inside of the cavity 312 with the reminder of the light-emitting device package 300 to allow outflow of the encapsulant 310 from the cavity 312 into the expansion volume. The expansion volume comprises the volume of the at least one opening 322 and the volume within the light-emitting device package 300.

In an alternative aspect (not shown in FIG. 3(a)), the at least one opening 322 is a blind opening. The blind opening 322 originates inside the cavity 312, i.e., the inner wall 306 of the support member 308, but does not pass completely through the support member 308. The expansion volume comprises the volume of the at least one opening 322.

Figure 3B:
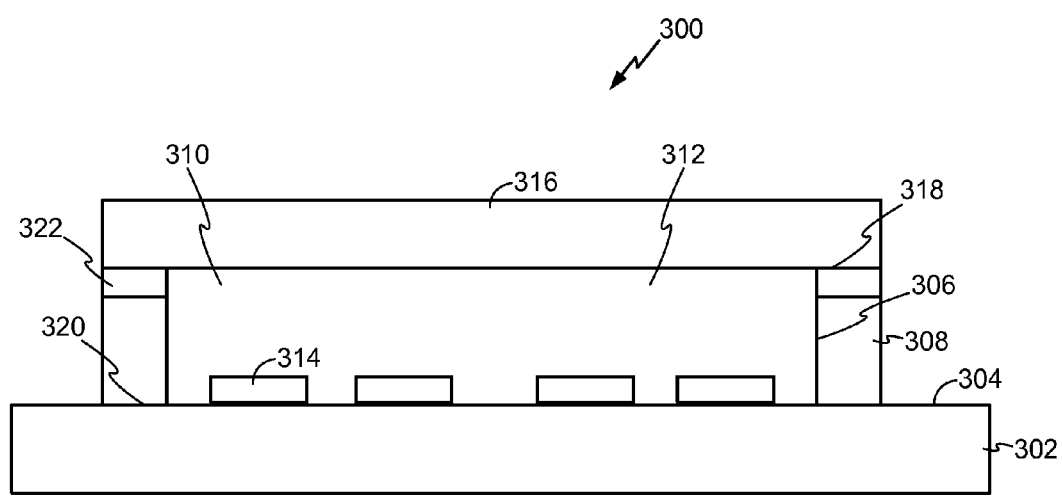

Referring now to FIG. 3(b), one or a plurality of openings 322 (plurality shown), is introduced into the upper face 318 of the support member 308. As depicted, the at least one opening 322 is a through opening, connecting the inside of the cavity 312 with the reminder of the light-emitting device package 300 to allow outflow of the encapsulant 310 from the cavity 312 into the expansion volume. The expansion volume comprises the volume of the at least one opening 322 and the volume of the reminder of the light-emitting device package 300.

In an alternative aspect, (not shown in FIG. 3(b)), the at least one opening 322 is a blind opening originating inside the cavity 312, i.e., the inner wall 306 of the support member 308, but not passing completely through the support member 308. The expansion volume comprises the volume of the at least one opening 322.

Figure 3C:
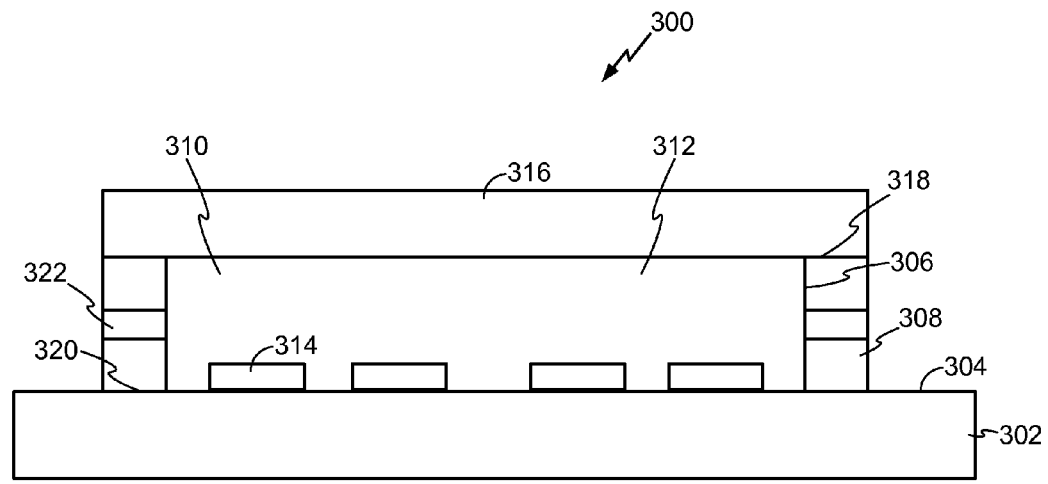

Referring now to FIG. 3(c), one or a plurality of openings 322 (plurality shown), are introduced into the support member 308. As depicted, the at least one opening 322 is a through opening, connecting the inside of the cavity 312 with the reminder of the light-emitting device package 300 to allow outflow of the encapsulant 310 from the cavity 312 into the expansion volume. The expansion volume comprises the volume of the at least one opening 322 and the volume of the reminder of the light-emitting device package 300.

In an alternative aspect (not shown in FIG. 3(c)), the at least one opening 322 is a blind opening originating inside the cavity 312, i.e., the inner wall 306 of the support member 308, but not passing completely through the support member 308. The expansion volume comprises the volume of the at least one opening 322.

Figure 3D:
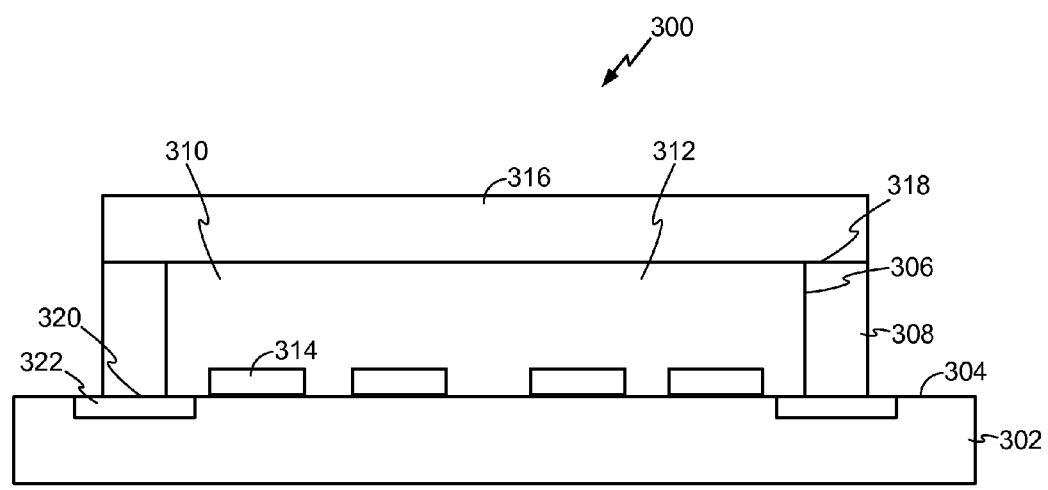

Referring now to FIG. 3(d), one or a plurality of openings 322 (plurality shown), is introduced as groove(s) in the substrate 302 into an area reserved for a placement of the support member 308 on the substrate 302. As depicted, the at least one opening 322 is a through groove. i.e., a groove whose length is such that when the support member 308 is attached onto the reserved area of the substrate 302, the at least one opening 322 connects the inside of the cavity 312 with the reminder of the light-emitting device package 300 to allow outflow of the encapsulant 310 from the cavity 312 into the expansion volume. The expansion volume comprises the volume of the at least one opening 322 and the volume of the reminder of the light-emitting device package 300.

In an alternative aspect (not shown in FIG. 3(d)), the at least one opening 322 is a blind groove, i.e., a groove whose length is such that when the support member 308 is attached onto the reserved area of the 302, the at least one opening 322 connects the inside of the cavity 312, as delimited by the inner wall 306 of the support member 308, but does not pass completely under the support member 308. The expansion volume comprises the volume of the at least one opening 322.

Figure 3E:
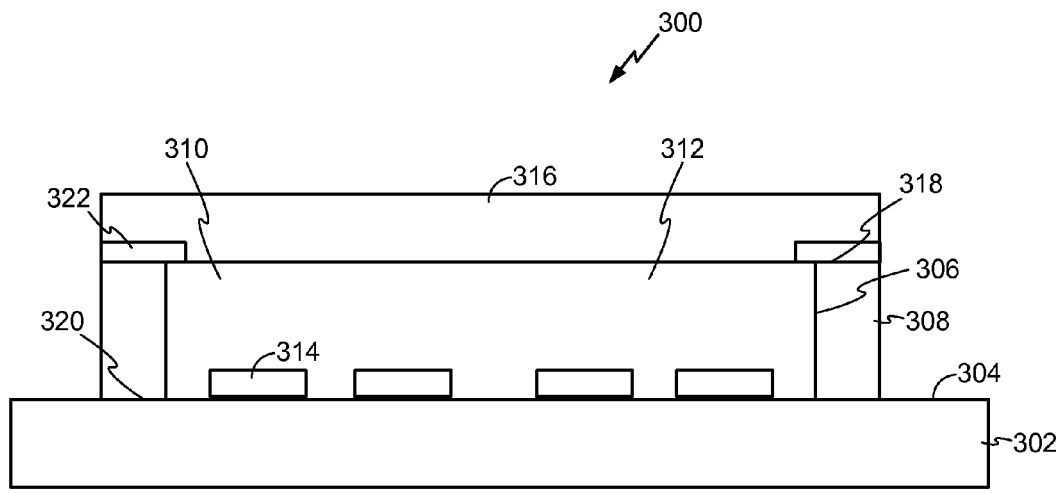

Referring now to FIG. 3(e), one or a plurality of openings 322 (plurality shown), is introduced as groove(s) in the light-transmissive cover 316 into an area reserved for a placement of the light-transmissive cover 316 on the support member 308. As depicted, the at least one opening 322 is a through groove, i.e., a groove whose length is such that when the support member 308 is attached onto the reserved area of the light-transmissive cover 316, the at least one opening 322 connects the inside of the cavity 312 with the reminder of the light-emitting device package 300 to allow outflow of the encapsulant 310 from the cavity 312 into the expansion volume. The expansion volume comprises the volume of the at least one opening 322 and the volume of the reminder of the light-emitting device package 300.

In an alternative aspect (not shown in FIG. 3(e)), the at least one opening 322 is a blind groove, i.e., a groove whose length is such that when the support member 308 is attached onto the reserved area of the light-transmissive cover 316, the at least one opening 322 connects the inside of the cavity 312, as delimited by the inner wall 306 of the support member 308, but does not pass completely under the support member 308. The expansion volume comprises the volume of the at least one opening 322.

Figure 3F:
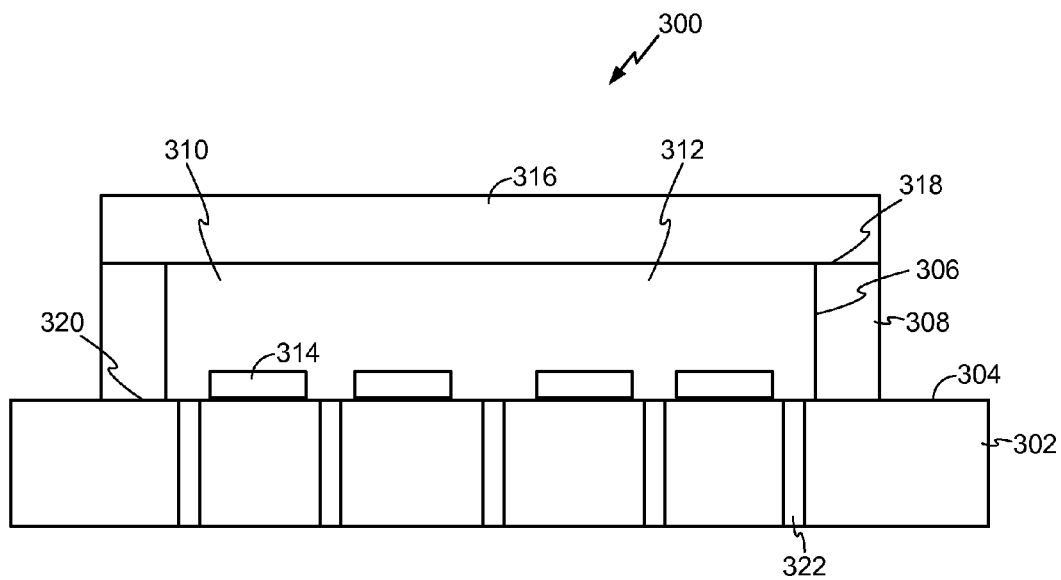

Referring now to FIG. 3(f), one or a plurality of openings 322 (plurality shown), is introduced as vertical opening in the substrate 302 so that when the support member 308 is attached onto a reserved area of the substrate 302, the at least one opening 322 lays inside the reserved area, i.e., an area delimited by the inner wall 306 of the support member 308. As depicted, the at least one opening 322 is a through opening. The through opening 322 originates on the upper face 304 of a substrate 302 inside the reserved area and passes completely through the support member 308. The through opening 322 thus connects the inside of the cavity 312 with the reminder of the light-emitting device package 300 to allow outflow of the encapsulant 310 from the cavity 312 into the expansion volume. The expansion volume comprises the volume of the at least one opening 322 and the volume of the reminder of the light-emitting device package 300.

In an alternative aspect (not shown in FIG. 3(f)), the at least one opening 322 is a blind opening. The blind opening 322 originates on the upper face 304 of a substrate 302 inside the reserved area, but does not pass completely through the support member 308. The expansion volume comprises the volume of the at least one opening 322.

From the foregoing FIG. 3(a)-(f) it is clear that the aspects of the disclosure differ by number, position, and shape of the opening(s) 322. A person skilled in the art will appreciate that the number, position, and shape of the opening(s) 322 is a design decision based on several factors, including, but not being limited to: operating temperature range, areas of stress, manufacturing considerations, assembly considerations, rheology of the encapsulant 310, and the like.

As means of an example regarding the number, the opening(s) 322 should allow the encapsulant 310 to flow into the opening(s) 322 in a manner not increasing the residual stress in the encapsulant 310 beyond an allowed level assuring that delamination will not occur.

Similarly, regarding the position, the opening(s) 322 should be placed at the area(s) of the highest stress. However, such area(s) may add cost to manufacturing process by requiring secondary operation on a part, e.g., drilling holes into stamped or cast reflecting ring 308.

Similarly, rheology of the encapsulant 310 together with the allowed level of residual stress will determine the shape of the opening(s) 322. Therefore, although the at least one opening 322 as depicted in FIG. 3(a)-(f) has a shape uniform in length and diameter, the shape may have non-uniform length and/or cross-section. A person skilled in the art will further appreciate that although the opening(s) 322 are disclosed and depicted as through openings, i.e., openings passing completely through the support member, thus connecting the inside of the cavity 310 with the outside, this may not be necessary in all design scenarios. As already described in the disclosure, the internal volume of the opening(s) 322 may be sufficient, or be designed to be sufficient, to absorb the increased volume of the encapsulant 310. In such a scenario the openings can be blind, i.e., not passing completely through the support member from the inside of the cavity 310. A person skilled in the art will appreciate that the opening(s) 322 are designed, as to size and shape, so that the rheology of the encapsulant 310 prevents filling of the opening(s) 322 during manufacturing process of the light-emitting device.

Considering the above-discussed design decisions, there is nothing that would prevent a person skilled in the art form combining the aspects of the disclosures depicted in FIG. 3, should such combination satisfy a design goal. As a means of an example, the aspect of FIG. 3(a) can be combined with the aspect of FIG. 3(c).

Consequently, since any of the configurations as depicted in FIG. 3 relieves the residual stress within the encapsulant 310, there is lower probability of delamination; consequently, the LED package 300 reliability and light extraction efficiency is improved.

The various aspects of this disclosure are provided to enable one of ordinary skill in the art to practice the present invention. Modifications to various aspects of a presented throughout this disclosure will be readily apparent to those skilled in the art, and the concepts disclosed herein may be extended to other applications. Thus, the claims are not intended to be limited to the various aspects of the reflective surfaces for a light-emitting device presented throughout this disclosure, but are to be accorded the full scope consistent with the language of the claims. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A sub-assembly for a light-emitting device package, the sub-assembly comprising:
a support member comprising an upper face adapted to be attached to a reserved area of a light-transmissive cover; a bottom face adapted to be attached to a reserved area of a substrate; and at least one blind opening originating in an inner wall of the support member.

2. The sub-assembly according to claim 1, wherein the at least one blind opening comprises an opening with a uniform cross-section.

3. The sub-assembly according to claim 1, wherein the at least one blind opening comprises an opening with a non-uniform cross-section.

4. The sub-assembly according to claim 1, wherein the at least one blind opening is introduced into the bottom face of the support member.

5. The sub-assembly according to claim 1, wherein the at least one blind opening is introduced into the upper face of the support member.

6. The sub-assembly according to claim 1, further comprising a light-transmissive cover attached to the upper face of the support member.

7. A sub-assembly for a light-emitting device package, the sub-assembly comprising:
a light-transmissive cover comprising a reserved area adapted to be attached to an upper face of a support member; and at least one groove introduced into the reserved area so that the length of the at least one groove exceeds transversal length of the reserved area.

8. The sub-assembly as claimed in claim 7, wherein the at least one groove is a through groove.

9. The sub-assembly as claimed in claim 7, wherein the at least one groove is a blind groove.

10. The sub-assembly as claimed in claim 7, further comprising:
a support member comprising an upper face attached to the reserved area of the light-transmissive cover; and a bottom face adapted to be attached to a substrate.

11. A sub-assembly for a light-emitting device package, the sub-assembly comprising:
a substrate comprising an area reserved for placement of a light-emitting device sub-assembly on the substrate; and at least one groove introduced into the reserved area.

12. The sub-assembly according to claim 11, wherein the at least one groove is a through groove.

13. The sub-assembly according to claim 11, wherein the at least one groove is a blind groove.

14. The apparatus sub-assembly to claim 11, wherein the light-emitting device sub-assembly comprises a support member, a bottom face of which is attached to the reserved area of the substrate.

15. The sub-assembly according to claim 11, wherein the light-emitting device sub-assembly further comprises a light-transmissive cover attached to the upper face of the support member.

16. The sub-assembly according to claim 15, wherein the support member and the light-transmissive cover light-emitting device sub-assembly comprises one part.

17. A sub-assembly for a light-emitting device package, the sub-assembly comprising:
a substrate comprising an area reserved for placement of a light-emitting device sub-assembly on the substrate; and at least one opening introduced as a vertical opening into the substrate inside the reserved area.

18. The sub-assembly according to claim 17, wherein the at least one opening is a through opening.

19. The sub-assembly according to claim 17, wherein the at least one opening is a blind opening.

20. The sub-assembly according to claim 17, wherein the light-emitting device sub-assembly comprises a support member, a bottom face of which is attached to the reserved area of the substrate.

21. The sub-assembly according to claim 20, wherein the light-emitting device sub-assembly further comprises a light-transmissive cover attached to the upper face of the support member.

22. The sub-assembly according to claim 21, wherein the support member and the light-transmissive cover light-emitting device sub-assembly comprises one part.

23. A light-emitting device package, comprising:
a substrate;
a support member;
a light-transmissive cover; and
an expansion volume connected with the inside of a cavity, the cavity being delimited by the substrate, the support member, and the light-transmissive cover,
wherein the expansion volume comprises at least a volume of at least one blind opening in the support member.

24. The light-emitting device package according to claim 23, wherein the light-transmissive cover is a clear light-transmissive cover.

25. The light-emitting device package according to claim 23, wherein the light-transmissive cover is a phosphors filled light-transmissive cover.

26. The light-emitting device package according to claim 23, wherein the light-transmissive cover is a phosphors coated light-transmissive cover.

27. The light-emitting device package according to claim 23, wherein the light-transmissive cover is thermally conductive.

28. The light-emitting device package according to claim 23, wherein the support member and the light-transmissive cover comprise a single component.

29. The light-emitting device package according to claim 23, wherein the at least one blind opening in the support member comprises an opening with a uniform cross-section.

30. The light-emitting device package according to claim 23, wherein the at least one blind opening in the support member comprises an opening with a non-uniform cross-section.

31. The light-emitting device package according to claim 23, wherein the at least one blind opening is introduced into the bottom face of the support member.

32. The light-emitting device package according to claim 23, wherein the at least one blind opening is introduced into the upper face of the support member.

33. A light-emitting device package, comprising:
a substrate;
a support member;
a light-transmissive cover; and
an expansion volume connected with the inside of a cavity, the cavity being delimited by the substrate, the support member, and the light-transmissive cover,
wherein the expansion volume comprises at least one groove introduced into a reserved area of the light-transmissive cover, wherein the reserved area comprises an area adapted to be attached to an upper face of the support member.

34. The light-emitting device package as claimed in claim 33, wherein the at least one groove is a through groove.

35. The light-emitting device package according to claim 33, wherein the at least one groove is a blind groove.

36. A light-emitting device package, comprising:
a substrate;
a support member;
a light-transmissive cover; and
an expansion volume connected with the inside of a cavity, the cavity being delimited by the substrate, the support member, and the light-transmissive cover,
wherein the expansion volume comprises at least one groove introduced into a reserved area of the substrate, wherein the reserved area comprises an area for placement of a bottom face of the support member on the substrate.

37. The light-emitting device package according to claim 36, wherein the at least one groove is a through groove.

38. The light-emitting device package according to claim 36, wherein the at least one groove is a blind groove.

39. A light-emitting device package, comprising:
a substrate;
a support member;
a light-transmissive cover; and
an expansion volume connected with the inside of a cavity, the cavity being delimited by the substrate, the support member, and the light-transmissive cover,
wherein the expansion volume comprises at least one opening introduced as a vertical opening into the substrate inside a reserved area of the substrate, wherein the reserved area comprises an area for placement of a bottom face of the support member on the substrate.

40. The light-emitting device package according to claim 39, wherein the at least one opening is a through opening.

41. The light-emitting device package according to claim 39, wherein the at least one opening is a blind opening.

* * * * *